(12) United States Patent
Kim et al.

(10) Patent No.: US 8,927,438 B2
(45) Date of Patent: Jan. 6, 2015

(54) METHODS FOR MANUFACTURING HIGH DIELECTRIC CONSTANT FILMS

(75) Inventors: Hyungjun Kim, Seoul (KR); Woo-Hee Kim, Seoul (KR); Min-Kyu Kim, Incheon (KR); Steven Hung, Sunnyvale, CA (US); Atif Noori, Saratoga, CA (US); David Thompson, San Jose, CA (US); Jeffrey W. Anthis, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 154 days.

(21) Appl. No.: 13/437,305

(22) Filed: Apr. 2, 2012

(65) Prior Publication Data

US 2012/0270409 A1  Oct. 25, 2012

Related U.S. Application Data

(60) Provisional application No. 61/477,422, filed on Apr. 20, 2011.

(51) Int. Cl.
| | |
|---|---|
| *H01L 21/31* | (2006.01) |
| *H01L 21/02* | (2006.01) |
| *C23C 16/40* | (2006.01) |
| *H01L 21/28* | (2006.01) |
| *H01L 29/51* | (2006.01) |

(52) U.S. Cl.
CPC .... *H01L 21/02189* (2013.01); *H01L 21/02192* (2013.01); *H01L 21/02194* (2013.01); *H01L 21/02271* (2013.01); *H01L 21/0228* (2013.01); *C23C 16/40* (2013.01); *H01L 21/28194* (2013.01); *H01L 29/517* (2013.01)
USPC ......................................... 438/763; 438/218

(58) Field of Classification Search
USPC .................................................. 438/763, 218
See application file for complete search history.

(56) References Cited

U.S. PATENT DOCUMENTS

| | | |
|---|---|---|
| 6,849,925 B1 | 2/2005 | Halliyal et al. |
| 2005/0202222 A1* | 9/2005 | Cartier et al. .................. 428/209 |
| 2007/0158702 A1 | 7/2007 | Doczy et al. |
| 2009/0047798 A1* | 2/2009 | Clark et al. .................... 438/778 |
| 2011/0039419 A1 | 2/2011 | Date et al. |

FOREIGN PATENT DOCUMENTS

WO  WO-2009/143456  11/2009

OTHER PUBLICATIONS

Chalker, P. R. et al., "Permittivity enhancement of hafnium dioxide high-k films by cerium doping", *Applied Physics Letters* 2008, 3 pages.
Niinisto, Jaakko et al., "Advanced cyclopentadienyl precursors for atomic layer deposition of ZrO2 thin films", *Journal of Materials Chemistry* 2008, pp. 3385-3390.
Niinisto, Jaakko et al., "Atomic Layer Deposition of HfO2 Thin Films Exploiting Novel Cyclopentadienyl Precursors at High Temperatures", *American Chemical Society* Jun. 1, 2007, 6 pages.
PCT International Search Report and Written Opinion in PCT/US2012/032902, mailed Oct. 31, 2012, 11 pgs.

* cited by examiner

*Primary Examiner* — Douglas Menz
(74) *Attorney, Agent, or Firm* — Servilla Whitney LLC

(57) ABSTRACT

Provided are methods for depositing a cerium doped hafnium containing high-k dielectric film on a substrate. The reagents of specific methods include hafnium tetrachloride, an organometallic complex of cerium and water.

11 Claims, 1 Drawing Sheet

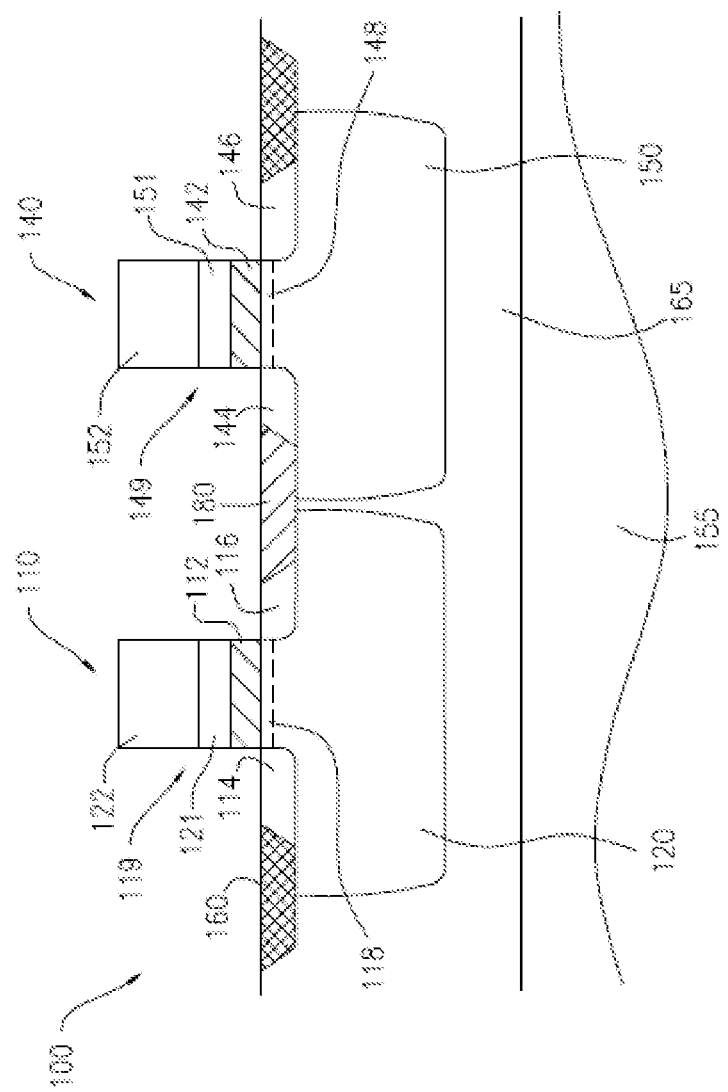

METHODS FOR MANUFACTURING HIGH DIELECTRIC CONSTANT FILMS

CROSS-REFERENCE TO RELATED APPLICATIONS

The application claims the benefit under 35 U.S.C. 119(e) of U.S. Provisional Application No. 61/477,422, filed Apr. 20, 2011.

BACKGROUND

Embodiments of the invention generally relate to methods for depositing materials. More specifically, embodiments of the invention are directed to methods of depositing high-k cerium doped hafnium films.

Microelectronic devices are fabricated on a semiconductor substrate as integrated circuits in which various conductive layers are interconnected with one another to permit electronic signals to propagate within the device. An example of such a device is a complementary metal-oxide-semiconductor (CMOS) field effect transistor (FET) or MOSFET.

Over the past decades, the MOSFET has continually been scaled down in size and modern integrated circuits are incorporating MOSFETs with channel lengths of less than 0.1 micron. Devices with a 65 nm feature size (with the channel being even shorter) are currently in production. The decrease in feature size has resulted in certain challenges because small MOSFETs exhibit higher leakage currents, and lower output resistance than larger devices. Still, smaller MOSFETs are desirable for several reasons. The main reason to make transistors smaller is to pack more and more devices in a given chip area, reducing the price per chip. Additionally, the reduction in transistor dimension can help increase the speed.

Because of small MOSFET geometries, the voltage that can be applied to the gate must be reduced to maintain reliability. To maintain performance, the threshold voltage of the MOSFET has to be reduced as well. As threshold voltage is reduced, the transistor cannot be switched from complete turn-off to complete turn-on with the limited voltage swing available. Subthreshold leakage, which was ignored in the past, now can have a significant impact on device performance.

A gate electrode is part of an integrated circuit. For example, a CMOS transistor comprises a gate structure disposed between source and drain regions that are formed in the semiconductor substrate. The gate structure generally comprises a gate electrode and a gate dielectric. The gate electrode is disposed over the gate dielectric to control a flow of charge carriers in a channel region that is formed between drain and source regions beneath the gate dielectric. The gate dielectric typically comprises a thin material layer having a dielectric constant of about 4.0 or greater (for example, gate oxides such as silicon dioxide (SiO2), silicon oxynitride (SiON), and the like). As the gate length of silicon CMOS devices is scaled to less than 100 nm, new high dielectric constant (K) materials will likely replace silicon oxide. In addition, metal gates will likely replace polycrystalline silicon (polysilicon) gates. For example, in some CMOS transistors, the gate electrode may be formed from at least one of a metal (e.g., titanium (Ti), tantalum (Ta), tungsten (W), and the like) and metal-containing conductive compound (e.g., titanium nitride (TiN), tantalum nitride (TaN), tungsten nitride (WN), and the like). Replacement of polysilicon as a traditional material of the gate electrode with metals and metal-containing compounds reduces undesired voltage drops associated with the polysilicon depletion effect, as well as increases drive current performance and the operational speed of the CMOS transistor.

The gate oxide, which serves as insulator between the gate and channel, should be made as thin as possible to increase the channel conductivity and performance when the transistor is on and to reduce subthreshold leakage when the transistor is off. However, with current gate oxides with a thickness of around 1.2 nm (which in silicon is ~5 atoms thick) the quantum mechanical phenomenon of electron tunneling occurs between the gate and channel, leading to increased power consumption.

Insulators (referred to as high-k dielectrics) that have a larger dielectric constant than silicon dioxide, such as group IVb metal silicates, for example, hafnium and zirconium silicates and oxides are being used to reduce the gate leakage. Increasing the dielectric constant of the gate dielectric allows a thicker layer while maintaining a high capacitance. (Capacitance is proportional to dielectric constant and inversely proportional to dielectric thickness.) Generally, a higher dielectric thickness reduces the quantum tunneling current through the dielectric between the gate and the channel. However, the difference in conduction band energy between the semiconductor and the dielectric (and the corresponding difference in valence band energy) impacts leakage current level. For the traditional gate oxide, silicon dioxide, the former barrier is approximately 8 eV. For many alternative dielectrics, the value is significantly lower, tending to increase the tunneling current, somewhat negating the advantage of higher dielectric constant.

As mentioned above, alternative materials have been proposed for use as gate dielectric materials, in particular hafnium-containing materials such as hafnium dioxide ($HfO_2$), and hafnium-containing silicate ($Hf_xSi_yO$). Although improvements to semiconductor gate electrodes have been made through the use of alternative gate metals and gate dielectric materials, further improvements are desired to improve the performance of integrated circuit devices, for example, to reduce leakage current density.

There is an ongoing need in the art for methods of rapidly and efficiently depositing high-k films.

SUMMARY

Embodiments of the invention are directed to methods for forming a high-k dielectric film. A hafnium containing precursor comprising hafnium tetrachloride is reacted with a substrate surface in a processing chamber to form a hafnium-containing film on the substrate. A cerium containing precursor is reacted with the substrate surface in a processing chamber to form a cerium-containing film on the substrate. An oxidant is reacted with the substrate surface to form a high-k dielectric layer on the substrate surface. The high-k dielectric layer comprises a mixture of hafnium oxide and cerium oxide.

In one or more embodiments, reacting the hafnium containing precursor, the cerium containing precursor and the oxidant occurs substantially simultaneously.

In some embodiments, each of the hafnium containing precursor, the cerium containing precursor and the oxidant are reacted with the substrate surface separately. In some embodiments, the oxidant is reacted with the substrate surface after each of the hafnium containing precursor and the cerium containing precursor.

Additional embodiments of the invention are directed to methods for forming a high-k dielectric film on a substrate surface. A hafnium oxide film is formed on the substrate surface by processing a first number of first reaction cycles.

Each first reaction cycle comprises exposing the substrate surface sequentially to hafnium tetrachloride and an oxidant selected from the group consisting of water, molecular oxygen, ozone, oxygen plasma and combinations thereof. A cerium oxide film is formed on the substrate surface by processing a second number of second reaction cycles. Each second reaction cycle comprising exposing the substrate surface sequentially to an organometallic complex of cerium and an oxidant selected from the group consisting of water, molecular oxygen, ozone, oxygen plasma and combinations thereof. One or more embodiments, further comprise a purge step to remove unreacted hafnium tetrachloride, water and organometallic complex of cerium before exposing the substrate surface to any additional reactants to prevent gas phase reactions.

Some embodiments are directed to methods for forming a high-k dielectric film on a substrate surface. The method comprise sequentially exposing the substrate surface to a first precursor gas and a second precursor gas. The first precursor gas comprises hafnium tetrachloride and a cerium containing organometallic complex. The second precursor gas comprises an oxidant. One or more embodiments further comprise purging unreacted first precursor gas prior to exposing the substrate surface to the second precursor gas and purging unreacted second precursor gas prior to exposing the substrate surface to the first precursor gas.

Further embodiments of the invention are directed to methods for forming a high-k dielectric film. The methods comprise substantially simultaneously reacting hafnium tetrachloride, a cerium containing organometallic complex and water with a substrate surface in a processing chamber to form a high-k dielectric film on the substrate.

In some embodiments, the hafnium containing precursor further comprises one or more of tetrakis(ethylmethylamido) hafnium, tetrakis(diethylamido)hafnium, tetrakis(dimethylamido)hafnium and combinations thereof.

In one or more embodiments, the cerium containing precursor is one or more of a Ce(III) and Ce(IV) organometallic complex. In one or more embodiments, the organometallic complex has a generic formula $CeX_aY_bZ_c$, where each of a, b, and c are in the range of 0 and 3 and the sum of a, b and c is about 3 or has a generic formula $CeW_dX_eY_fZ_g$, where d, e, f and g are each in the range of 0 and 4 and the sum of d, e, f and g is about 4. In some embodiments, each of W, X, Y and Z are independently selected from the group consisting of halides, N,N'-diisopropylformamidinate, 2,2-dimethyl-3-methoxypropoxide, bis(trimethylsilyl)amide, 2,2,6,6-tetramethyl-hepta-3,5-dionate, compounds of the formula

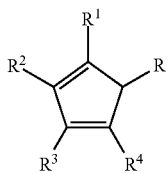

where each of R, $R^1$, $R^2$, $R^3$ and $R^4$ are independently selected from the group consisting of hydrogen and alkyl chains have in the range of 1 to 4 carbons.

In some embodiments, the organometallic complex is homoleptic. In some embodiments, the organometallic complex is heteroleptic.

In one or more embodiments, the oxidant is selected from the group consisting of water, ozone, molecular oxygen and combinations thereof. In some embodiments, the oxidant is water.

In one or more embodiments, the high-k dielectric layer comprises at least about 0.5% cerium. In one or more embodiments, the film is a layer in a MOSFET exhibiting a leakage current density less than about 100 A/cm² at an operating voltage in a range of about −2 volts to about +2 volts. In some embodiments, the high-k dielectric is about 5 to about 50 angstroms thick. In some embodiments, the high-k dielectric has a dielectric constant greater than the dielectric constant of a high-k dielectric film formed without the cerium precursor or the organometallic complex of cerium.

One or more embodiments further comprise performing one or more of a post-deposition annealing on the high-k dielectric layer and a decoupled plasma nitridation process on the high-k dielectric layer. Some embodiments further comprise pre-cleaning the substrate prior to reacting any of the hafnium containing precursor, the cerium containing precursor and the oxidant with the substrate surface.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

FIG. 1 is a cross-sectional view of a field effect transistor pair.

DETAILED DESCRIPTION

One aspect of the present invention relates to methods for manufacturing high K dielectric films, which may be utilized in the manufacture of MOSFETS and other devices incorporating high K dielectric films. Another aspect of the invention relates to articles of manufacture including, but not limited to, high K dielectric films and devices that include high K dielectric films.

Embodiments of the invention are useful in the manufacture of semiconductor devices, including but not limited to semiconductor devices that require a capacitive element. Examples of such devices include metal oxide semiconductor field effect transistors (MOSFET), metal oxide semiconductor capacitor (MOSCAP), metal-insulator-metal capacitors (MIMCAP), and metal-insulator-semiconductor capacitor (MISCAP). With scaling semiconductor devices that require capacitive elements, the equivalent oxide thickness (EOT) is reduced to improve the device performance at each node. The reduction in EOT comes with an unwanted increase in leakage current. At a specified EOT value, a higher-k material will allow a physically thicker film, and thus provide lower leakage current. The typical materials used in the industry today with a higher-k than $SiO_2$ or SiN include $HfO_2$, $ZrO_2$ and $Al_2O_3$ with k-values of approximately 25, 30 and 9, respectively. At below the 3X node, there is a need for high-k films with greater dielectric constants (k) than these materials.

Embodiments of the invention utilize a known film, $HfO_2$, doped with another oxide with a higher-k value. Both ceria ($CeO_2$) (also referred to as cerium oxide ($CeO_x$)) and hafnium oxide ($HfO_x$) have similar bonding structures, therefore combining these materials should provide a film with reduced defects compared to what would obtained with materials with dissimilar bonding structures. The hafnium oxide film (including the doped hafnium oxide film) can be grown by either atomic layer deposition (ALD) or chemical vapor deposition (CVD) processes. The films are grown with a combination of a hafnium precursor, a cerium precursor and an oxidant. In some CVD processes, the hafnium precursor, cerium precursor and oxidant are flowed simultaneously to the processing chamber. In some ALD processes, there are a first number of first cycles comprising contacting a substrate surface with a first precursor followed by precursor removal, followed by the oxidant followed by oxidant removal and a second number of second cycles comprising flowing the second precursor followed by precursor removal, followed by flowing oxidant followed by oxidant removal. Each cycle does not need to be identical (e.g., the first number of first cycles can be different from the second number of second cycles, and the first number and second number can vary from cycles to cycle). In various ALD processes the hafnium precursor and cerium precursor are mixed and flowed toward the substrate followed by removal of excess followed by flowing oxidant toward the substrate surface followed by removal of excess oxidant. After deposition, the film may go through a post-deposition treatment such as annealing or plasma nitridation to improve the material quality or change the morphology (e.g., crystallinity) to benefit the device performance.

Hafnium oxide has several polymorphs, each with a different dielectric constant. These polymorphs (and dielectric constants) are amorphous (k~16-19), monoclinic (k~20-25), cubic (k~29) and tetragonal (k~70). Typically, hafnium oxide high-k dielectrics are in the monoclinic phase as the cubic and tetragonal phases are metastable at atmospheric pressure and generally require high temperatures (~1700-2700° C.) to transform from monoclinic to cubic or tetragonal. Without being bound by any particular theory of operation, it is believed that doping the hafnium oxide film with cerium oxide stabilizes the cubic or tetragonal phases at lower temperature and the doped films described may be at least partially of the tetragonal phase.

One or more embodiments of the present invention provide methods that are particularly useful in forming complementary metal oxide semiconductor (CMOS) integrated-circuit devices and will be described in that context. Other devices and applications are also within the scope of the invention. FIG. 1 illustrates portions of a cross sectional view of a FET pair in a typical CMOS device. The FET pair shown comprises an NMOS FET and a PMOS FET, but it will be understood that the CMOS device can comprise additional FETs, and include FETs having the same conductivity type. Device 100 comprises a silicon wafer 155 doped with a p-type material, a p-type epitaxial silicon layer 165 on wafer 155, a p-type well region 120 and an n-type well region 150 defined in epitaxial layer 165, an n-type transistor (NMOS FET) 110 defined in p-well 120 and a p-type transistor (PMOS FET) 140 defined in n-well 150. Region 180 electrically isolates NMOS 110 and PMOS 140 transistors and region 160 electrically isolates the pair of transistors 110 and 140 from other semiconductor devices on substrate 155.

According to one or more embodiments of the invention, NMOS transistor 110 comprises a gate region 119, source region 114 and a drain region 116. The gate region 119 includes a first metal region 121 and a second metal region 122. The source and drain regions are n-type regions on opposite sides of the gate region 119. Channel region 118 is interposed between source region 114 and drain region 116. A gate dielectric layer 112 separates channel region 118 and first metal region 121. Gate dielectric layer 112 electrically insulates first metal region 121 from channel region 118. The gate dielectric layer 112, the first metal region 121 and second metal region 122 together may be referred to herein as a gate stack. The gate dielectric region 112 according to one or more embodiments is a high K dielectric hafnium-containing material such as $HfO_2$. The first metal region 121 comprises a conductor material, typically a metal such as tantalum nitride (TaN), which may formed by atomic layer deposition (ALD). The second metal region 122 comprises a metal, for example, tantalum, which may be formed by any suitable process such as PVD. When an appropriate voltage is applied between p-type silicon wafer 155 and gate region 122, electrons from p-well 120 move into region 118 directly below dielectric layer 112 thereby creating an n-type channel 118. A voltage applied between source 114 and drain 116 causes current to flow between source 114 and drain 116.

According to one or more embodiments, PMOS transistor 140 comprises a gate region 149, a source region 144 and a drain region 146. The gate region 149 includes a first metal region 151 and a second metal region 152. The source and drain regions are p-type regions on opposite sides of gate region 149. Channel region 148 is interposed between source region 144 and drain region 146. A gate dielectric 142 separates channel region 148 and first metal region 151. Dielectric 142 electrically insulates first metal region 151 from channel region 148. The gate dielectric layer 142, the first metal region 151 and second metal region 152 together may be referred to herein as a gate stack. Suitable gate materials include nitride materials such as, but not limited to, TiN and TaN. In one or more embodiments, the first metal region 151 comprises a metal, typically TaN. The second metal region 152 comprises a metal, for example, tantalum. When an appropriate voltage is applied between p-type silicon wafer 155 and gate region 149, holes from n-well 150 move into region 148 directly below dielectric layer 142 thereby creating a p-type channel 148. A voltage applied between source 144 and drain 146 causes current to flow between source 144 and drain 146.

MOS device design is a complicated process. For example, in the design of MOSFETs, improvements made by maximizing drive current result in increased leakage current. Conversely, an improvement such as decreased leakage current negatively impacts the drive current.

Embodiments of the invention described herein involve the formation of hafnium-containing films on substrates. Examples of substrates include, but are not limited to, semiconductor wafers, such as crystalline silicon (e.g., Si<100> or Si<111>), silicon oxide, silicon germanium, doped or undoped polysilicon, doped or undoped silicon wafers silicon nitride and patterned or non-patterned wafers.

Surfaces include bare silicon wafers, films, layers and materials with dielectric, conductive and barrier properties and include aluminum oxide and polysilicon. Pretreatment of surfaces includes polishing, etching, reduction, oxidation, hydroxylation, annealing and baking.

A substrate can be pretreated to be terminated with a variety of functional groups such as hydroxyls (OH), alkoxy (OR, where R=Me, Et, Pr or Bu), haloxyls (OX, where X=F, Cl, Br or I), halides (F, Cl, Br or I), oxygen radicals, aminos (NH or $NH_2$) and amidos (NR or $NR_2$, where R=Me, Et, Pr or Bu). A pretreatment can be accomplished by administering a reagent, such as $NH_3$, $B_2H_6$, $SiH_4$, $SiH_6$, $H_2O$, HF, HCl, $O_2$, $O_3$, $H_2O_2$, $H_2$, atomic-H, atomic-N atomic-O, alcohols or amines.

Many industrial applications exist for the product compounds synthesized by the various embodiments of the invention. Within the microelectronics industry, the product compounds are used as high-k transistor gate dielectric materials, transistor gate interface engineering, high-k capacitor dielectric materials (DRAMs), seed layers, diffusion barrier layers, adhesion layers, insulator layers, conducting layers and functionalized surface groups for patterned surfaces (e.g., selective deposition).

Accordingly, one or more embodiments of the invention are directed to methods for forming a high-k dielectric film. A hafnium containing precursor is reacted with a substrate surface in a processing chamber to form a hafnium containing film on the substrate. As used in this specification and the appended claims, the term "substrate surface" refers to either a bare substrate surface or a substrate surface having a layer thereon. For example, if a first processing step deposits a layer A and precursor B reacts with the substrate surface, the precursor B can react with either the bare substrate or the layer A. A cerium containing precursor is reacted with the substrate surface in the processing chamber to form a cerium containing film on the substrate. An oxidant is reacted with the substrate surface to form a high-k dielectric layer on the substrate surface. The high-k dielectric layer comprises a mixture of hafnium oxide and cerium oxide. The order of the reactions (e.g., hafnium, cerium and oxidant) can be modified as needed and is discussed further herein Some embodiments are directed to methods for forming a high-k dielectric film on a substrate surface. A hafnium oxide film is formed on the substrate surface by processing a first number of first reaction cycles. Each first reaction cycle comprises exposing the substrate surface sequentially to a hafnium containing precursor followed by exposure to water. A cerium oxide film is formed on the substrate surface by processing a second number of second reaction cycles. Each second reaction cycle comprises exposing the substrate surface sequentially to a cerium containing precursor followed by water.

The number of cycles for each of the first reaction cycles and the second reaction cycles can be modified as needed depending on, for example, the desired composition of the resultant film, the concentration of the reactants, the processing temperature, etc. Additionally, the first number of reaction cycles and the second number of reaction cycles do not need to be processed en mass. For example, if there are 100 first reaction cycles, these can be processed all at once, or can be split into groups of at least one reaction cycle with the second reaction cycle being interspersed between. The same is true for the number of cycles for the second reaction. As another example, the first reaction cycle may be repeated 10 times followed by a single cycle of the second reaction. This may be repeated to result in a total of, for example, 100 cycles of the first reaction and 10 cycles of the second reaction. Embodiments of this sort are particularly useful in atomic layer deposition processes.

Additional embodiments of the invention are directed to methods for forming a high-k dielectric film on a substrate surfacecomprising sequentially exposing the substrate surface to a first precursor gas and a second precursor gas. The first precursor gas comprises a hafnium containing compound and a cerium containing compound and the second precursor gas comprising an oxidant. Therefore, rather than depositing multiple layers (or partial layers) of the hafnium compound following multiple layers (or partial layers) of the cerium compound, mixed hafnium-cerium layers can be deposited. For this type of process to be successful, the hafnium containing compound and the cerium containing compound should not be spontaneously reactive or there will be gas phase reactions prior to deposition on the substrate surface. Embodiments of this sort can be deposited with atomic layer deposition processing.

In one or more embodiments, each of the hafnium containing precursor, the cerium containing precursor and the oxidant are reacted with the substrate surface separately. In some embodiments, the oxidant is reacted with the substrate surface after each of the hafnium containing precursor and the cerium containing precursor. For example, after the hafnium containing precursor reacts with the surface, the oxidant reacts with the surface and then the cerium containing precursor reacts with the surface followed by the oxidant reacting with the surface. This is a common type of atomic layer deposition process and can be accomplished with known apparatuses.

In some embodiments, reacting the hafnium containing precursor, the cerium containing precursor and the oxidant occurs substantially simultaneously, as in a chemical vapor deposition apparatus. In one or more embodiments, forming a high-k dielectric film comprising substantially simultaneously reacting hafnium tetrachloride, a cerium containing organometallic complex and water with a substrate surface in a processing chamber to form a high-k dielectric film on the substrate.

Many precursors are within the scope of the invention. Precursors may be a plasma, gas, liquid or solid at ambient temperature and pressure. However, within the ALD chamber, precursors are volatilized. Organometallic compounds or complexes include any chemical containing a metal and at least one organic group, such as alkyls, alkoxyls, alkylamidos and anilides. Precursors can be comprised of organometallic and Inorganic/halide compounds. Where any of the precursors are plasma, the frequency of power used to generate the plasma can be any known frequency including, but not limited to, 2 MHz, 13.56 MHz, 40 MHz and 60 MHz.

Exemplary hafnium precursors include hafnium compounds containing ligands such as alkylamidos, cyclopentadienyls, halides, alkyls, alkoxides and combinations thereof. Alkylamido hafnium compounds used as hafnium precursors include $(RR'N)_4Hf$, where R and R' are independently hydrogen, methyl, ethyl, propyl or butyl. Specific hafnium precursors include: $(Et_2N)_4Hf$, $(Me_2N)_4Hf$, $(EtMeN)_4Hf$, $(t-BuC_5H_4)_2HfCl_2$, $(C_5H_5)_2HfCl_2$, $(EtC_5H_4)_2HfCl_2$, $(Me_5C_5)_2HfCl_2$, $(Me_5C_5)HfCl_3$, $(i-PrC_5H_4)_2HfCl_2$, $(i-PrC_5H_4)HfCl_3$, $(t-BuC_5H_4)_2HfMe_2$, $(acac)_4Hf$, $(hfac)_4Hf$, $(tfac)_4Hf$, $(thd)_4Hf$, $Br_4Hf$, $Cl_4Hf$, $I_4Hf$, $(NO_3)_4Hf$, $(t-BuO)_4Hf$, $(i-PrO)_4Hf$, $(EtO)_4Hf$ and $(MeO)_4Hf$.

In one or more embodiments, the hafnium containing precursor is hafnium tetrachloride. In some embodiments, in addition to hafnium tetrachloride, the hafnium containing precursor further comprises one or more of tetrakis(ethylmethylamido)hafnium, tetrakis(diethylamido)hafnium, tetrakis(dimethylamido)hafnium and combinations thereof.

Exemplary cerium containing precursors include organometallic complexes of Ce(III) and Ce(IV), although complexes with other cerium oxidation states are not excluded. In one or more embodiments, the organometallic complex has a generic formula $CeX_aY_bZ_c$, where each of a, b, and c are in the range of 0 and 3 and the sum of a, b and c is about 3 or has a generic formula $CeW_dX_eY_fZ_g$, where d, e, f and g are each in the range of 0 and 4 and the sum of d, e, f and g is about 4. Each of W, X, Y and Z in some embodiments, are independently selected from the group consisting of halides, N,N'-diisopropylformamidinate (iPr-AMD), 2,2-dimethyl-3-methoxypropoxide (MMP), bis(trimethylsilyl)amide, 2,2,6,6-tetramethylhepta-3,5-dionate (THD), compounds of the formula

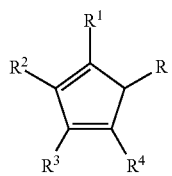

where each of R, $R^1$, $R^2$, $R^3$ and $R^4$ are independently selected from the group consisting of hydrogen and alkyl chains have in the range of 1 to 4 carbons. The organometallic complex can be either homoleptic or heteroleptic. In one or more embodiments, the cerium containing precursor comprises tris (isopropylcyclopentadienyl)cerium ($Ce(i-PrCp)_3$). In some embodiments, the cerium containing precursor comprises $Ce(MMP)_4$.

Exemplary oxidants include, but are not limited to, $H_2O$, $H_2O_2$, $O_3$, $O_2$, NO, $N_2O$, $NO_2$, $N_2O_5$, alcohols (e.g., ROH, where R=Me, Et, Pr and Bu), peroxides (organic and inorganic) carboxylic acids and radical oxygen compounds (e.g., O, $O_2$, $O_3$ and OH radicals). Radical oxygen compounds can be produced by heat, hot-wires and/or plasma. In some embodiments, the oxidant is water.

The processes of the invention can be carried out in equipment known in the art of ALD, CVD, etc. The apparatus brings the sources into contact with a heated substrate on which the films are grown. Hardware that can be used to deposit films is an ALD apparatus as disclosed in U.S. patent application Ser. No. 10/251,715, filed Sep. 20, 2002, assigned to Applied Material, Inc., Santa Clara, Calif. and entitled "An Apparatus for the Deposition of High K dielectric Constant Films," published as United States Application Publication No. 2003/0101938. The substrate is often supported on a pedestal which may include an embedded resistive heater or other heating device. This may allow for precise control over the temperature of the substrate. Additionally, the pedestal may be configured to rotate the substrate. This rotation can be either continuous or in discreet steps. For example, the substrate may be rotated only between process steps, however the substrate may be only rotated ring processing, to form a more uniform film on the substrate surface.

The properties of the resultant film can vary depending on the specific precursors used, the concentrations, number of reaction cycles, etc. In one or more embodiments, the resultant high-k dielectric layer comprises at least about 5% cerium based on atomic percent cerium to cerium plus hafnium. In various embodiments, the high-k dielectric layer comprises at least about 0.5%, 1%, 2%, 3%, 4%, 5%, 6%, 7%, 8%, 9%, 10%, 15%, 20%, 25%, 30%, 35%, 40%, 45% or 50% cerium based on atomic percent cerium to total cerium and hafnium. In some embodiments, the high-k dielectric layer comprise an atomic ratio of cerium to hafnium of greater than about 1:100, 1:50, 1:40, 1:30, 1:20, 1:15, 1:10, 1:5, 1:2 or 1:1.

In some embodiments, the resultant film is a layer in a MOSFET exhibiting a leakage current density less than about 100 A/$cm^2$ at an operating voltage in a range of about +2 volts to about −2 volts. According to one or more embodiments, the high-k dielectric film has an equivalent oxide thickness (EOT) of less than about 15 Å. In various embodiments, the EOT of the high-k dielectric film is less than about 14 Å, 13 Å, 12 Å, 11 Å, 10 Å, 9 Å, 8 Å, 7 Å, 6 Å or 5 Å. In one or more embodiments, the high-k dielectric film has a capacitance-equivalent thickness (CET) less than about 19 Å. In various embodiments, the high-k dielectric film has a CET less than about 18 Å, 17 Å, 16 Å, 15 Å, 14 Å, 13 Å, 12 Å, 11 Å, 10 Å or 9 Å.

The thickness of the resultant high-k dielectric layer can be changed depending on, for example, the concentration of precursors and number of reaction cycles. In one or more embodiments the thickness of the layer is greater than about 0.5 Å, 1 Å, 2 Å, 5 Å, 10 Å, 15 Å, 20 Å, 25 Å, 30 Å, 35 Å, 40 Å, 45 Å, 50 Å, 75 Å, 100 Å, 150 Å, 200 Å, 250 Å, 300 Å, 400 Å, 500 Å, 600 Å, 700 Å, 800 Å, 900 Å or 1000 Å. In one or more embodiments, the layer has a thickness in the range of about 1 Å to about 1000 Å, or in the range of about 2 Å to about 500 Å, or in the range of about 3 Å to about 250 Å, or in the range of about 4 Å to about 200 Å, or in the range of about 5 Å to about 100 Å, or in the range of about 5 Å to about 50 Å, or in the range of about 10 Å to about 80 Å, or in the range of about 20 Å to about 50 Å.

In one or more embodiments, the high-k dielectric layer has a dielectric constant greater than the dielectric constant of a high-k dielectric film formed without the cerium precursor. In various embodiments, the high-k dielectric layer has a dielectric constant greater than about 20, 25, 30, 35, 40, 45, 50, 55, 60, 65, 70, 75 or 80. In some embodiments, the high-k dielectric layer has a dielectric constant in the range of about 20 to about 80, or in the range of about 25 to about 70, or in the range of about 30 to about 60, or in the range of about 40 to about 50, or in the range of about 20 to about 50.

After depositing the high-k film, additional processing may be performed. In one or more embodiments, the processing methods further comprise performing one or more of a post-deposition annealing on the high-k dielectric layer and a decoupled plasma nitridation process on the high-k dielectric layer.

Some embodiments also include additional pre-high-k deposition processes. In one or more embodiments, the methods further comprise pre-cleaning the substrate prior to reacting any of the hafnium containing precursor, the cerium containing precursor and the oxidant with the substrate surface. Non-limiting examples of pre-cleaning processes include pre-annealing, hydroxylation treatment (e.g., HF-last or SiCoNi). In some embodiments, one or more of the additional pre-deposition processes and produce deposition processes are performed without exposing the substrate to the ambient environment. When multiple chambers are employed, they are arranged, for example, they are arranged as a cluster tool. As will be known to those skilled in the art, a cluster tool is one in which more than one processing chamber are in communication with a central transfer station. Such a transfer station will generally include at least one robot capable of moving the substrates between chambers.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method for forming a high-k dielectric film, comprising:
   reacting a mixture of a hafnium-containing precursor and a cerium-containing precursor with a substrate surface in a processing chamber to form a hafnium—and cerium-containing film on the substrate; and
   reacting an oxidant with the hafnium—and cerium-containing film on the substrate surface to form a high-k dielectric layer on the substrate surface, the high-k dielectric layer comprising a mixture of hafnium oxide and cerium oxide.

2. The method of claim 1, wherein the hafnium containing precursor comprises hafnium tetrachloride and optionally further comprises one or more of tetrakis (ethylmethylamido) hafnium, tetrakis(diethylamido)hafnium, tetrakis(dimethylamido)hafnium or combinations thereof.

3. The method of claim 1, wherein the cerium containing precursor is one or more of a Ce(III) and Ce(IV) organometallic complex.

4. The method of claim 3, wherein the organometallic complex has a generic formula $CeX_aY_bZ_c$, where each of a, b, and c are in the range of 0 and 3 and the sum of a, b and c is about 3 or has a generic formula $CeW_dX_eY_fZ_g$, where d, e, f and g are each in the range of 0 and 4 and the sum of d, e, f and g is about 4.

5. The method of claim 4, wherein each of W, X, Y and Z are independently selected from the group consisting of halides, N,N'-diisopropylformamidinate, 2,2-dimethyl-3-methoxypropoxide, bis(trimethylsilyl)amide, 2,2,6,6-tetramethylhepta-3,5-dionate, compounds of the formula

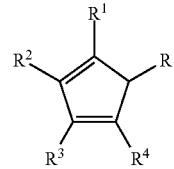

where each of R, $R^1$, $R^2$, $R^3$ and $R^4$ are independently selected from the group consisting of hydrogen and alkyl chains have in the range of 1 to 4 carbons.

6. The method of claim 1, wherein the oxidant is selected from the group consisting of water, ozone, molecular oxygen and combinations thereof.

7. The method of claim 1, wherein the high-k dielectric layer comprises at least about 0.5% cerium.

8. The method of claim 1, further comprising performing one or more of a post-deposition annealing on the high-k dielectric layer and a decoupled plasma nitridation process on the high-k dielectric layer.

9. The method of claim 1, wherein the film is a layer in a MOSFET exhibiting a leakage current density less than about 100 A/cm² at an operating voltage in a range of about −2 volts to about +2 volts.

10. The method of claim 1, wherein the high-k dielectric has a dielectric constant greater than the dielectric constant of a high-k dielectric film formed without the cerium precursor.

11. The method of claim 1, wherein the hafnium—and cerium-containing film has a dielectric constant greater than about 30.

* * * * *